United States Patent
Klapper et al.

(10) Patent No.: US 9,987,928 B2
(45) Date of Patent: Jun. 5, 2018

(54) METHOD AND DEVICE FOR TESTING A TRACTION BATTERY OF AN ELECTRIC VEHICLE

(71) Applicant: OMICRON electronics GmbH, Klaus (AT)

(72) Inventors: Ulrich Klapper, Rankweil (AT); Oliver Janke, Hemhofen (DE)

(73) Assignee: OMICRON ELECTRONICS GMBH, Klaus (AT)

( * ) Notice: Subject to any disclaimer, the term of this patent is extended or adjusted under 35 U.S.C. 154(b) by 130 days.

(21) Appl. No.: 15/038,123

(22) PCT Filed: Nov. 24, 2014

(86) PCT No.: PCT/EP2014/075408
§ 371 (c)(1),
(2) Date: May 20, 2016

(87) PCT Pub. No.: WO2015/078813
PCT Pub. Date: Jun. 4, 2015

(65) Prior Publication Data
US 2016/0288648 A1    Oct. 6, 2016

(30) Foreign Application Priority Data
Nov. 29, 2013    (AT) .............. A 50786/2013

(51) Int. Cl.
*B60L 1/00*    (2006.01)
*B60L 3/00*    (2006.01)
(Continued)

(52) U.S. Cl.
CPC ......... *B60L 3/0046* (2013.01); *B60L 11/1816* (2013.01); *B60L 11/1842* (2013.01);
(Continued)

(58) Field of Classification Search
CPC ............... B60L 3/0046; B60L 11/1816; B60L 2240/547; G01R 31/3606; Y02T 10/7044;
(Continued)

(56) References Cited

U.S. PATENT DOCUMENTS

2011/0078092 A1    3/2011    Kim et al.
2012/0323386 A1    12/2012    Ito
(Continued)

FOREIGN PATENT DOCUMENTS

DE    10 2009 027595 A1    1/2010
DE    10 2011 083150 A1    3/2013
(Continued)

*Primary Examiner* — Jared Fureman
*Assistant Examiner* — Duc M Pham
(74) *Attorney, Agent, or Firm* — Preti Flaherty Beliveau & Pachios LLP (57) ABSTRACT

For testing a traction battery (5) of an electric vehicle (1), which battery is both chargeable and dischargeable via a charging-discharging interface (2), a control command for initiating a discharging process of the traction battery (5) is generated. The discharging process is monitored by a testing apparatus (10). At least one characteristic quantity of the traction battery (5) is determined depending on the monitored discharging process.

13 Claims, 4 Drawing Sheets

(51) Int. Cl.
*B60L 11/18* (2006.01)
*G01R 31/36* (2006.01)
*H01M 10/44* (2006.01)

(52) U.S. Cl.
CPC ....... *B60L 11/1857* (2013.01); *B60L 11/1861* (2013.01); *G01R 31/3606* (2013.01); *H01M 10/448* (2013.01); *B60L 2240/547* (2013.01); *B60L 2240/549* (2013.01); *Y02E 60/721* (2013.01); *Y02T 10/705* (2013.01); *Y02T 10/7005* (2013.01); *Y02T 10/7044* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y04S 10/126* (2013.01)

(58) Field of Classification Search
CPC ... Y02T 90/163; Y04S 10/126; Y02E 60/721; H01M 10/448
See application file for complete search history.

(56) References Cited

U.S. PATENT DOCUMENTS

| 2013/0179061 A1* | 7/2013 | Gadh | B60L 11/1842 701/123 |
| 2013/0190968 A1* | 7/2013 | Nitzberg | G07C 3/00 701/31.6 |
| 2013/0275783 A1* | 10/2013 | Liu | G01R 31/3606 713/310 |
| 2015/0095233 A1* | 4/2015 | Wild | B60L 11/1848 705/44 |

FOREIGN PATENT DOCUMENTS

| EP | 2575231 A2 | 4/2013 |
| EP | 2612783 A1 | 7/2013 |
| WO | WO 2010/051477 A2 | 5/2010 |
| WO | WO 2013/156621 A1 | 10/2013 |

\* cited by examiner

METHOD AND DEVICE FOR TESTING A TRACTION BATTERY OF AN ELECTRIC VEHICLE

The invention relates to methods and devices for testing a traction battery of a vehicle. In particular, the invention relates to methods and devices for testing a traction battery of an electric vehicle, for example, an all-electric vehicle or a hybrid vehicle.

Electric vehicles are becoming increasingly important technically and economically. Electric vehicles are understood to be vehicles with an electric drive. The electric drive is supplied with energy in operation by a traction battery. The traction battery may, for example, comprise a plurality of interconnected storage battery cells or blocks as energy storage devices for driving the electric vehicle. The electric vehicle may be an all-electric vehicle or a hybrid vehicle which in addition to the electric drive comprises at least one further drive and an energy storage system associated with the further drive.

In many conventional electric vehicles, the traction battery can be charged via a charging connector. To charge the traction battery an all-electric vehicle has to be temporarily connected via the charging connector to an electrical network to charge the traction battery of the electric vehicle. Hybrid vehicles too can be temporarily connected via the charging connector to the electrical network to charge the traction battery of the electric vehicle. In stand-alone hybrid vehicles the traction battery can be charged via the internal combustion engine or when braking (so-called recuperation).

The discharging of the traction battery has been gaining in importance recently, for example in the context of so-called V2G ("Vehicle-to-Grid") technologies, in which the traction battery can be discharged into an electrical network. Such approaches allow the use of the traction battery as an energy storage device. In an intelligent energy network, which is also referred to in the art as a so-called "smart grid", the energy flow between the electrical network and the electric vehicle can be reversed so that the energy flow takes place from the traction battery into the electrical network. Through such measures the electrical network can, at times of particularly high load or in the event of failure of a scheduled generator, such as, for example, a wind power plant, be supported in the short term. Through targeted discharges an adaptation of the available energy in the electrical network to the actual consumption can take place if this for example is different from the predictions of an energy supplier. The charging and discharging of the traction battery can be performed with a combined charging-discharging connector of the electric vehicle.

The traction battery is an important and expensive component of the electric vehicle. For various reasons it is desirable to be able to test the traction battery and thus assess its state. For example, the state of the traction battery, for example its capacity or the maximum available energy in a V2G discharging process, may considerably affect the value of an electric vehicle on the used car market. The assessment of the state of the traction battery based on data of an on-board computer can be error-prone. In addition, such an assessment would require an adaptation of the readout process to the design and programming of various on-board computers. This increases the cost and/or the error susceptibility in the assessment of the state of the traction battery.

The object of the invention is to provide improved methods and devices for testing a traction battery. The object of the invention is in particular to provide such methods and devices with which the measurement or data acquisition required for the testing can be carried out via an interface which has a uniform design for different electric vehicles, where the traction battery for the test does not have to be removed or otherwise exposed.

According to embodiments of the invention, methods and devices having the features specified in the independent claims are provided. The dependent claims define further exemplary embodiments.

According to exemplary embodiments of the invention, a discharging process is initiated for testing the traction battery. The traction battery is discharged via a charging-discharging interface of the vehicle. By monitoring and evaluating the discharging process, which may for example comprise a detecting and temporal integrating of the discharging current or power, the state of the traction battery can be tested. For example, the capacity of the traction battery, an efficiency of the traction battery with its associated charging-discharging electronics or another characteristic quantity for assessing the state of the traction battery can be determined.

Since the charging-discharging interface has to be adapted for coupling to charging stations, a testing apparatus may have an interface which is adapted for coupling to the charging-discharging interface of the electric vehicle. The adaptation of the charging-discharging interface to the configuration of a charging station allows the interface of the testing apparatus to be usable for different vehicle types and vehicle types from different manufacturers. A knowledge of the design, programming and/or versioning of the programming of an on-board computer of the electric vehicle is not required for testing the traction battery.

A method for testing a traction battery of an electric vehicle, which battery is both chargeable and dischargeable via a charging-discharging interface, comprises generating a control command for initiating a discharging process of the traction battery. The method comprises monitoring the discharging process of the traction battery. The method comprises determining at least one characteristic quantity of the traction battery depending on the monitored discharging process.

In the method, the fact that the electric vehicle can also be discharged via the charging-discharging interface, can be used to test the traction battery. For example, the battery can be charged via the charging connector as fully as charging-discharging electronics of the electric vehicle will allow, and then discharged as far as the charging-discharging electronics of the electric vehicle will allow. Thus, for example, the maximum net available energy content of the battery can be tested.

The control command can be transmitted via the charging-discharging interface to the electric vehicle. At least one line for transmission of control commands can be provided in the charging-discharging-interface and the interface, couplable thereto, of the testing apparatus. Alternatively or additionally, the control command can be modulated as a signal on the supply line and read out from the electric vehicle. The energy transmission during discharging can be carried out via a connection contact, via which commands are transmitted from a testing apparatus to the electric vehicle and/or data or other information are transmitted from the electric vehicle to the testing apparatus.

The control command can also be generated according to a V2G ("Vehicle-to-Grid") protocol.

The control command can be a command of the V2G protocol, with which in a V2G network operation a feeding of energy from the traction battery into an electrical network, such as a building network or an energy network, is initiated. This allows the use of conventional defined commands of the V2G protocol.

The control command with which on the testing the discharging process is initiated can be a dedicated control command which is reserved only for testing the traction battery.

The control command can be transmitted via an interface of the electric vehicle to the electric vehicle, which interface is different from the charging-discharging interface.

During the discharging process, at least part of the energy stored in the traction battery is fed into an electrical network, for example a building network or an energy network of an energy supply company. This reduces the costs associated with the testing of the traction battery, because the energy is not dissipated locally but is available for other consumers.

The monitoring of the discharging process can comprise a detecting of the electrical charge and/or electrical energy discharged from the traction battery during the discharging process. A discharging current can be detected and temporally integrated to determine the energy and/or charge.

The determination of the at least one characteristic quantity of the traction battery can comprise determining the total electrical energy provided during a discharging process. The determination of the at least one characteristic quantity of the traction battery can comprise determining a capacity of the traction battery depending on the electrical charge and/or electrical energy discharged from the traction battery during the discharging process.

In the method, the battery can be not only discharged but also charged. The determination of the at least one characteristic quantity of the traction battery can comprise determining a system efficiency which indicates a relationship between the total energy provided by the traction battery via the charging-discharging interface during a discharging process and the energy needed for charging.

The method can further comprise initiating a charging process of the traction battery and monitoring the charging process.

To initiate the charging process, a further control command can be transmitted to the electric vehicle.

The at least one characteristic quantity of the traction battery can be determined depending on the monitored charging process and the monitored discharging process.

The method can be performed by a mobile testing apparatus.

The testing apparatus can be supplied with energy via the charging-discharging interface of the vehicle while carrying out the method.

At least one predefined and/or user-configurable load cycle for the discharging process can be stored in the testing apparatus. The testing of the battery can comprise a discharging process in accordance with a load cycle in which a load at the charging-discharging interface, a speed and/or a power is changed time-dependently during discharging.

According to a further exemplary embodiment, a device for testing a traction battery of an electric vehicle, which battery is both chargeable and dischargeable via a charging-discharging interface, is specified. The apparatus comprises an interface for outputting a control command to initiate a discharging process of the traction battery. The device comprises a monitoring unit, couplable to the charging-discharging interface, for monitoring the discharging process of the traction battery and for determining at least one characteristic quantity of the traction battery depending on the monitored discharging process.

The device can be configured as a mobile testing apparatus, in particular as a portable testing apparatus.

The device can be configured for a releasable coupling to the charging-discharging interface.

The device can be adapted to carry out the method according to an exemplary embodiment.

The device can be adapted to generate the control command according to a V2G ("Vehicle-to-Grid") protocol.

The device can be adapted to generate a command of the V2G protocol for initiating the discharging process during the battery testing, with which command in a V2G network operation a feeding of energy from the traction battery into an electrical network is initiated.

The device can be adapted to generate a dedicated control command for initiating the discharging process during the battery testing, which command is reserved exclusively for the testing of the traction battery.

The device can be adapted to provide the control command via the charging-discharging interface of the electric vehicle to the electric vehicle.

The device can be adapted to transmit the control command via an interface of the electric vehicle to the electric vehicle, which interface is different from the charging-discharging interface.

The device can be adapted to feed, during the discharging process, at least part of the energy stored in the traction battery into an electrical network, for example a building network or an energy network of an energy supply company.

The monitoring unit can be adapted to detect an electrical discharge and/or electrical energy discharged from the traction battery. The monitoring unit can be adapted to detect and to temporally integrate a discharging current.

The monitoring unit can be adapted to determine the total electrical energy provided during a discharging process and a capacity of the traction battery depending on the electrical charge and/or electrical energy discharged from the traction battery during the discharging process.

The monitoring unit can be adapted to initiate a charging process of the traction battery.

The monitoring unit can be adapted to determine a system efficiency which indicates a relationship between the total energy provided by the traction battery via the charging-discharging interface during a discharging process and the energy required for charging.

The device can be adapted to transmit a further control command to the electric vehicle for initiating the charging process.

The monitoring unit can be adapted to determine the at least one characteristic quantity of the traction battery depending on the monitored charging process and the monitored discharging process.

The device can comprise a memory, in which the at least one predefined and/or user-configurable load cycle for the discharging process can be stored. The device can be adapted to change a load and/or a power during the discharging process in accordance with the load cycle time-dependently.

According to a further exemplary embodiment, a system is specified which comprises an electric vehicle having a traction battery and an apparatus for testing the traction battery. The electric vehicle can have a charging-discharging interface via which the traction battery is both chargeable and dischargeable. The device for testing is configured as a device according to an exemplary embodiment.

In methods, devices and systems according to exemplary embodiments, the charging-discharging interface of the electric vehicle can be a charging-discharging connector.

The interface, couplable thereto, of the device for testing the traction battery can be a connector with corresponding connections.

The invention will be explained in more detail below with reference to the drawings using preferred embodiments. In the drawings, identical reference symbols designate identical elements.

Figure 1:
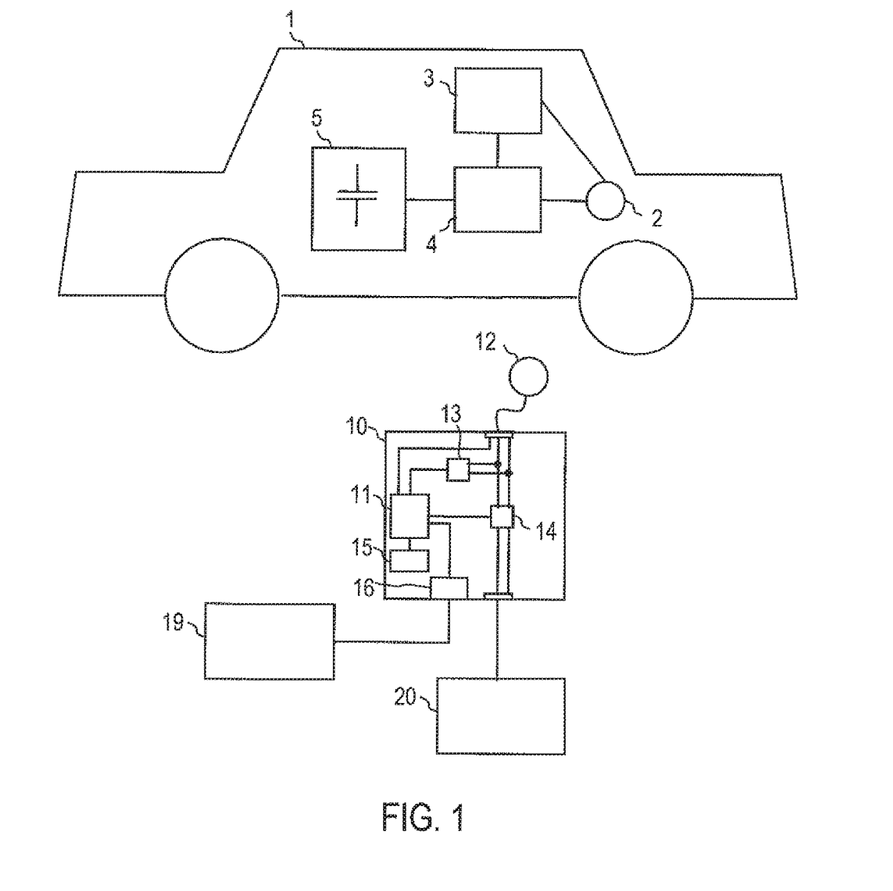
FIG. 1 shows a schematic representation of a system having a testing apparatus according to an exemplary embodiment.

FIG. 1 shows a system with an electric vehicle 1 and a device 10 for testing a traction battery 5. The electric vehicle 1 comprises an electric drive (not shown), which is powered by the traction battery 5. The electric vehicle 1 may be an all-electric vehicle. Alternatively, the electric vehicle 1 may be a hybrid vehicle which in addition to the electric drive comprises at least one further drive and in addition to the traction battery 5 comprises at least one further energy storage system for the further drive. The traction battery 5 may, for example, comprise a plurality of interconnected storage battery cells or blocks as the energy storage device for driving the electric vehicle 1.

The electric vehicle 1 comprises the traction battery 5 and charging-discharging electronics 4 which are adapted to selectively charge or discharge the traction battery 5 via a charging-discharging interface. The electric vehicle 1 may have as charging-discharging interface a charging-discharging connector 2. The charging-discharging connector 2 serves as an interface, with which the electric vehicle 1 can be selectively connected to an energy network, for example to a charging station of an energy network, or when testing the traction battery to the testing apparatus 10. The vehicle 1 may comprise control electronics 3, which may comprise an on-board network with a control device or a plurality of control devices and/or an on-board computer.

The device for testing the traction battery may be configured as a testing apparatus 10. The testing apparatus 10 may be mobile, in particular portable. The testing apparatus 10 has an interface 12 which is releasably couplable to the charging-discharging connector 2 of the electric vehicle 1. The interface 12 may comprise an arrangement of electrical contacts and/or of mechanical connection elements, which corresponds to the arrangement of electrical contacts and/or of mechanical connection elements of a charging station for charging the traction battery 5 of the electric vehicle via the charging-discharging connector 2.

For a testing of the traction battery 5, the interface 12 of the testing apparatus 10 is connected to the charging-discharging connector 2. The testing apparatus 10 initiates a discharging process. For this purpose, the testing apparatus 10 can generate a control command which is transmitted either via the charging-discharging connector 2 or an interface of the electric vehicle 1 separate therefrom to the electric vehicle 1.

In response to the control command, the traction battery 5 of the electric vehicle can be discharged as fully as possible. In the case of some electric vehicles, the charging-discharging electronics 4 of the electric vehicle 1 can be set up so that they do not allow complete discharge of the traction battery 5. In this case, the charging-discharging electronics 4 can control the discharging process in response to the control command such that the traction battery 5 is discharged as far as is permitted by the charging-discharging electronics 4 during the battery test.

At least during the discharging process initiated by the control command, the testing apparatus 10 can monitor the energy flow which is directed during the discharging process from the traction battery 5 via the charging-discharging connector 2 to the testing apparatus 10. The monitoring of the discharging process may comprise a monitoring of the current intensity of the discharging current flowing from the traction battery 5 via the charging-discharging connector 2 to the testing apparatus 10. Alternatively or additionally, the monitoring of the discharging process may comprise a determining of a total electrical charge flowing from the traction battery 5 via the charging-discharging connector 2 to the testing apparatus 10. For this purpose, a current intensity of the discharging current can be monitored and for example computationally integrated. Alternatively or additionally, the monitoring of the discharging process may comprise a monitoring of the electrical power provided by the traction battery 5 via the charging-discharging connector 2. Alternatively or additionally, the monitoring of the discharging process may comprise a determining of the total energy which is provided by the traction battery 5 during the discharging process. For this, the power can be monitored and for example computationally integrated.

The appropriate monitoring functions can be performed by a monitoring unit 11 of the testing apparatus 10. The monitoring unit 11 may comprise one or more processors, microprocessors, controllers, microcontrollers, application-specific special circuits (ASIC) and/or other integrated semiconductor circuits, or a combination thereof. The monitoring unit 11 may comprise at least one measuring resistor for detecting the output current of the electric vehicle 1.

During the discharging process, the output power and/or output current intensity which is provided by the electric vehicle 1 when discharging the traction battery 5, and/or the discharging speed may be changed time-dependently in a load cycle (also referred to as loading cycle in the art). When monitoring the discharging process, the testing apparatus can monitor the electrical current and/or the power time-dependently and correlate them with several different load levels, which are set during the load cycle. The load cycle can be controlled by the testing apparatus 10. For this purpose, the testing apparatus 10 can generate control commands for a change of load, which are provided either via the charging-discharging connector 2 or an interface of the electric vehicle 1 separate therefrom to the electric vehicle 1. Alternatively or additionally, the testing apparatus 10 can provide a time-varying load for the electric vehicle to conduct a load cycle.

The load cycle may be predefined and stored in a memory 15. Alternatively or additionally, the load cycle may be configurable by a user. The generation and modulation of the control commands to change the load can be effected by the monitoring unit 11. The monitoring unit 15 can modulate the control commands to change the load via the interface 12 to the electric vehicle 1. Alternatively or additionally, a load cycle may take place also by adjusting at least one parameter of a load circuit of the testing apparatus 10. The load circuit may comprise for example a feedback circuit 14 for feeding energy back into an electronic network 20. The feedback circuit 14 may be integrated in the testing apparatus 10.

At least during the discharging process, the testing apparatus 10 may be supplied with energy via the interface 12 and the charging-discharging connector 2 of the electric vehicle 1. The testing apparatus 10 may be adapted to be supplied with energy by the electric vehicle 1 via the interface 12 already when the load cycle is configured and/or the control command, which initiates the discharging process, is generated. The testing apparatus 10 may have a supply circuit 13 which is coupled to the interface 12. The supply circuit 13 may be adapted to generate a supply voltage for the monitoring unit 11 and/or other elements of the testing apparatus 10 from the energy flow which flows during the discharging process via the charging-discharging connector 2 of the electric vehicle 1 to the testing apparatus 10.

The testing apparatus 10 can be adapted to feed the energy, discharged from the traction battery 5 during the discharging process, back into an electrical network 20. The testing apparatus 10 can comprise the feedback circuit 14 for this purpose. The feedback circuit 14 may comprise at least one converter or another converter, to allow the output current of the electric vehicle 1 to be fed back into the electrical network 20. The electrical network 20 may be a building network. The electrical network 20 may be an energy network of an energy supplier. The electrical network 20 is a fixedly installed network which is different from an on-board network of the electric vehicle.

The feedback ensures that the energy discharged from the traction battery 5 is not simply dissipated, but can be provided to other consumers. This can reduce the cost of the battery test. During the discharging process, a first part of the energy discharged from the traction battery 5 can be converted to supply the testing apparatus 10. A second part of the energy discharged from the traction battery 5 can be converted for feedback into the electrical network 20. For feedback of energy into the electrical network 20 the testing apparatus 10 is releasably connected, for example via a conventional power outlet, to the electrical network 20.

In addition to at least one discharging process, the testing apparatus 10 can be adapted to control at least one charging process of the traction battery 5 for battery testing. For example, the testing apparatus 10 for testing the traction battery 5 may firstly fully discharge and then fully charge the traction battery 5. Then a further discharging process may be optionally carried out. To test the traction battery, the testing apparatus 10 can determine from the relationship between discharging energy and charging energy an efficiency of the traction battery 5 with the associated power electronics. The determination of the efficiency can be determined in dependence on the charging and discharging speed and/or in dependence on the charging and discharging power.

The testing apparatus 10 may include a user interface. The test can be started and/or configured via the user interface. For example, the charging and/or discharging powers, the charging and/or discharging speeds, the timing etc. of a load cycle may be selected or configured in a user-defined manner. Alternatively or additionally, the testing apparatus 10 may comprise an interface 16 for coupling to an external computer, for example a portable computer 19.

The control commands for triggering the discharging process and possible further control commands with which, for example, a load cycle is conducted and/or a charging process is initiated, can be provided in different ways to the electric vehicle. In the embodiment shown in FIG. 1, the interface 12 of the testing apparatus 10 has at least one connection via which control commands can be transmitted. The charging-discharging connector 2 of the electric vehicle has a corresponding connection for receiving the control commands. The control commands can be further processed by the control electronics 3 and/or the charging-discharging electronics 4.

The control commands can be generated in each case according to a V2G protocol. The evaluation of appropriate control commands of the V2G protocol is implemented in the electric vehicle 1 for V2G functions. The control command with which the discharging process of the traction battery 5 for the battery test is triggered may be the same control command with which the electric vehicle 1 is caused to feed energy back into the electrical network 20 in a V2G operation without a battery test. Alternatively, the control command with which the discharging process of the traction battery 5 is triggered for the battery test may be a control command of the V2G protocol reserved for the battery test which is not used for normal V2G applications. For example, the control command with which the discharging process of the traction battery 5 is triggered for the battery test, may allow a further discharging of the traction battery 5 than control commands for discharging in conventional V2G applications. The electric vehicle 1 can be adapted to implement the control commands and to carry out, depending on the control command, different discharging processes for the battery test and for conventional V2G applications, in which a feedback of energy into the electrical network 20 takes place without a battery test.

The testing apparatus 10 can be configured for a variety of different methods for battery testing. Exemplary methods are described in more detail with reference to FIG. 2 to FIG. 4.

Figure 2:
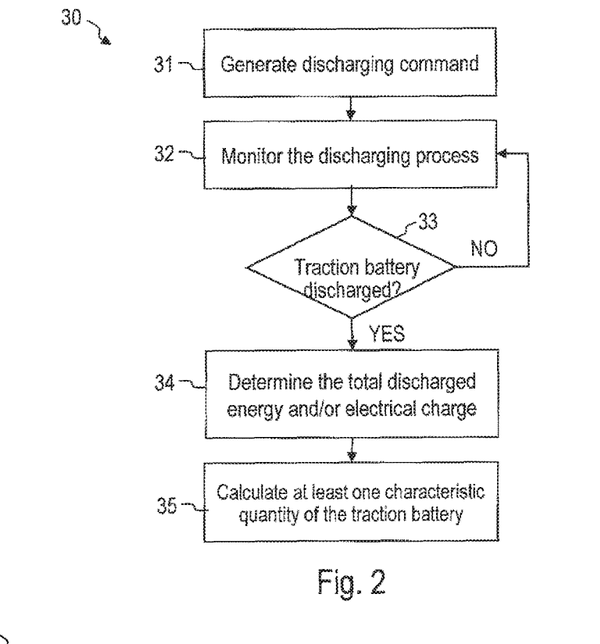
FIG. 2 is a flowchart of a method according to an exemplary embodiment.

FIG. 2 is a flowchart of a method 30 for testing a traction battery. The method 30 may be performed automatically by the testing apparatus 10. For this purpose, an interface 12 of the testing apparatus 10 is coupled to the charging-discharging connector 2 of the electric vehicle 1.

At step 31, a control command to discharge the traction battery is generated. The control command can be transmitted via the interface 12 of the testing apparatus 10 and the charging-discharging connector 2 to the electric vehicle 1. The control command can be generated according to a V2G protocol.

At step 32, the discharging process is monitored. For this purpose, for example a current intensity, a total electrical charge, an output power of the electric vehicle, or a total electrical energy can be determined.

At step 33, it can be checked whether the discharging process has been completed. In the method 30, the traction battery can discharged as far as is permitted by the charging-discharging electronics 4 of the electric vehicle 1. The end of the discharging process may signalled by the electric vehicle 1 or detected automatically by the testing apparatus 10, for example based on a value and/or a temporal change of the output current of the electric vehicle 1. If the discharging process is not yet completed, the monitoring is continued at step 32.

At step 34, optionally a total electrical energy and/or a total electrical charge which was provided during the discharging process by the traction battery via the charging-discharging connector 2, can be determined. For this purpose, the power and/or the output current which has been detected at step 32, can be computationally integrated.

At step 35, at least one characteristic quantity for the state of the traction battery 5 can be calculated or otherwise determined. As a characteristic quantity, for example, there may be determined the maximum net available energy content of the traction battery, which can be ascertained by temporal integration of the output power of the electric vehicle at the charging-discharging connector 2. The characteristic quantity can be calculated from the discharging behaviour at different powers, for example, when the discharging power and/or discharging speed is changed in a load cycle.

The characteristic quantity can be outputted via a user interface of the testing apparatus 10 and/or be stored non-volatilely in the testing apparatus 10.

The battery testing may comprise in addition to a discharging process also at least one charging process or at least one further discharging process. This allows for example the determination of the efficiency, which can be defined as the relationship between the maximum discharging energy provided during discharging via the charging-discharging connector 2 and the charging energy required for fully charging.

Figure 3:
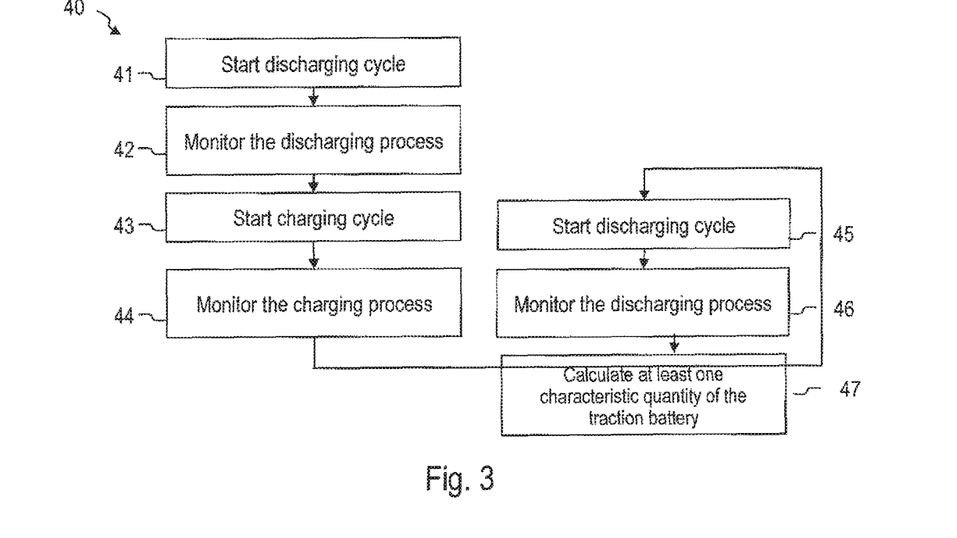
FIG. 3 is a flowchart of a method according to a further exemplary embodiment.

FIG. 3 is a flowchart of a method 40 for testing a traction battery. The method 40 may be performed automatically by the testing apparatus 10. For this purpose, an interface 12 of the testing apparatus 10 is coupled to the charging-discharging connector 2 of the electric vehicle 1. The testing apparatus 10 is coupled to an electrical network 20.

At step 41, a discharging cycle is started in order to discharge the traction battery 5 as fully as possible. At step 42, optionally the discharging process may be monitored. However, this is not absolutely necessary, because the required data collection and evaluation for the battery testing can also be carried out during a subsequent discharging process at step 46.

At step 43, after the discharging of the traction battery 5, a charging process is started. At step 44, the charging process is monitored. This may comprise a monitoring of the energy and/or power flowing via the interface 12 and the charging-discharging connector 2 to the electric vehicle 1. At step 44, the total charging energy can be determined, for example, by integrating the power or the current intensity during the charging process.

At step 45, a further discharging cycle is started after the traction battery 5 has been fully charged. At step 46, the discharging process is monitored. The monitoring of the discharging process can take place as described with reference to step 32 of the method 30.

At step 47, at least one characteristic quantity for the state of the traction battery 5 may be calculated or otherwise determined. As a characteristic quantity, for example, there may be determined the maximum net available energy content of the battery, which can be ascertained by temporal integration of the output power of the electric vehicle at the charging-discharging connector 2. As a characteristic quantity, additionally or alternatively there may be calculated the efficiency, which can be defined as the relationship between the maximum discharging energy provided during discharging via the charging-discharging connector 2 and the charging energy required for fully charging.

When charging and/or discharging the traction battery 5 during the test, the testing apparatus 10 can change the speed and/or power with which the charging and/or discharging is effected, time-dependently in a load cycle. From the behaviour which the traction battery 5 shows on presetting different speeds and/or powers during charging and/or discharging, a characterisation of the traction battery 5 can also be made.

Figure 4:
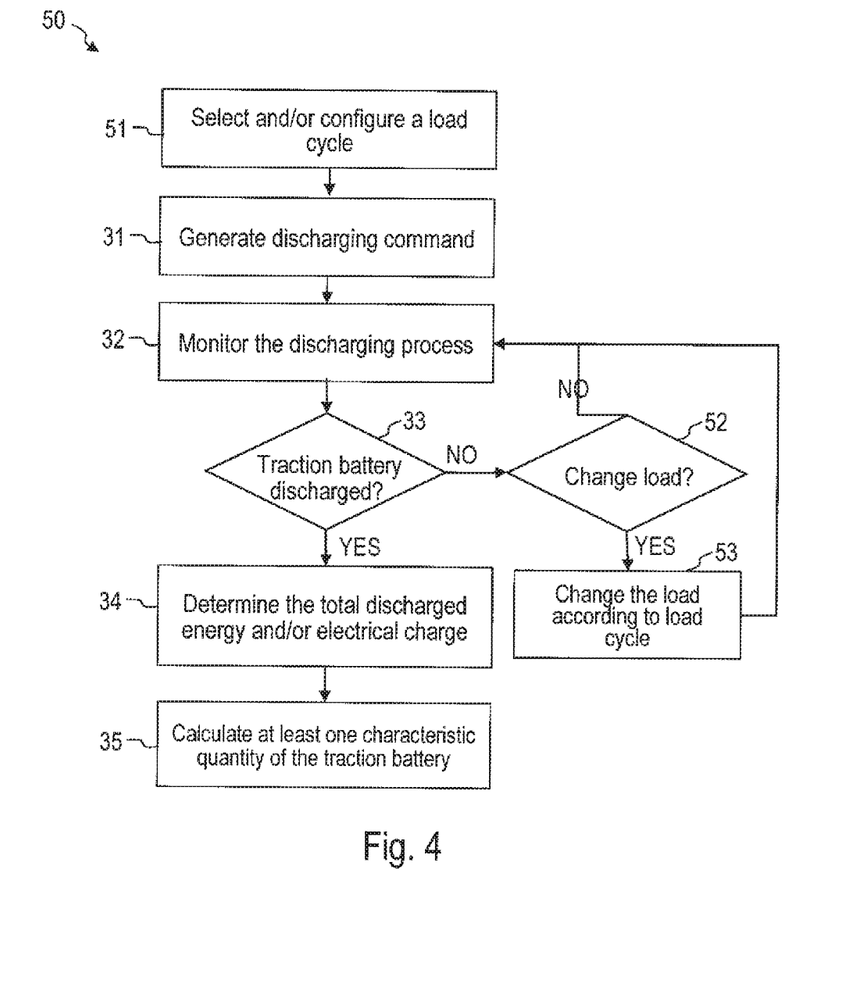
FIG. 4 is a flowchart of a method according to a further exemplary embodiment.

FIG. 4 is a flowchart of a method 50 for testing a traction battery. The method 50 may be performed automatically by the testing apparatus 10. For this purpose, an interface 12 of the testing apparatus 10 is coupled to the charging-discharging connector 2 of the electric vehicle 1. The testing apparatus 10 is coupled to an electrical network 20.

At step 51, a load cycle can be user-defined or automatically selected and/or configured. For example, one of a plurality of predefined load cycles which are stored in the testing apparatus 10 can be selected.

At steps 31, 32 and 33, a control command to initiate the discharging process is then generated, the discharging process is monitored, and it is checked whether the discharging process is completed. These steps can be performed as described with reference to FIG. 2.

If it is determined at step 33 that the discharging process is continued, it is checked at step 52 whether according to the load cycle a load is to be changed. The load cycle may define for example different powers and/or discharging speeds as a function of time. A change of the power and/or the discharging speed can be made by the testing apparatus 10 at the times at which the load cycle provides a corresponding load change. If it is determined at step 52 that the load is to be changed, at step 53, the load can be reset according to the load cycle. The method then returns to step 32 to continue the monitoring of the discharging process time-dependently.

The setting of a new load may comprise transmitting a control command to the charging-discharging electronics of the electric vehicle. Alternatively or additionally, the testing apparatus itself can change the load. For example, a load behaviour of the testing apparatus 10 can be changed so that a different current flow and thus a different power take-off ensues. To change the load, an adjustable component of the testing apparatus can be influenced in a controlled manner. For example, at least one circuit component of the feedback circuit 14 of the testing apparatus 10, e.g. the switching frequency of a clocked converter circuit, an adjustable resistor, an adjustable capacitor etc. can be influenced to change the load behaviour. Through the controlled influencing of the at least one adjustable component, it is possible, for example, to change the energy fed back from the electric vehicle 2 into the electrical network 20 and thus the current flow of the discharging current and/or the power take-off If it is determined at step 33 that the discharging process is completed, at step 34 optionally a further computational processing of the acquired data may take place. At step 35, a characteristic quantity of the traction battery can be computationally determined. For this purpose, the discharging behaviour can be further evaluated at different powers and/or speeds to draw conclusions about the state of the traction battery 5, for example, to detect an ageing of traction battery 5.

Numerous other modifications of the described methods and devices may be implemented in further exemplary embodiments. For example, the control device 10 may also be adapted to transmit control commands for triggering a discharging process and/or for controlling a load cycle during the discharging process, not via the charging-discharging connector 2, but via an interface separate therefrom to the electric vehicle 1. Alternatively, a energy transmission for discharging and/or charging the traction battery 5 can take place via a control pin of a charging-discharging connector 2, as PLC ("Power-Line Communication").

Figure 5:
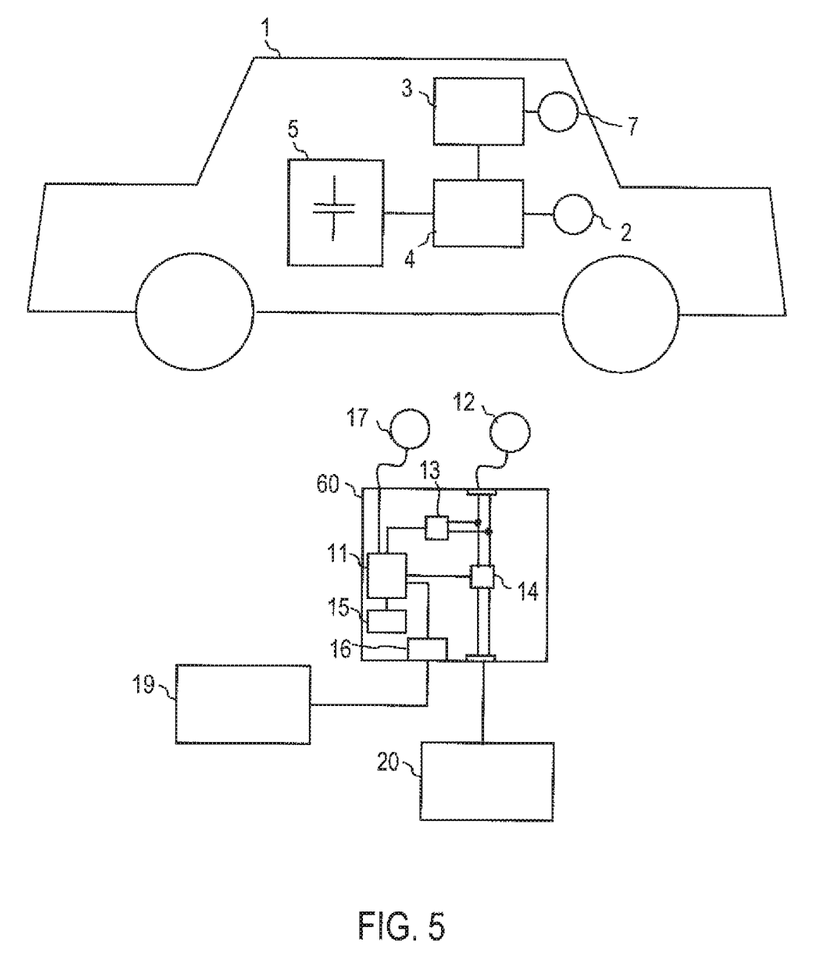
FIG. 5 shows a schematic representation of a system having a testing apparatus according to a further exemplary embodiment.

FIG. 5 shows a system with an electric vehicle 1 and a testing apparatus 60. The electric vehicle 1 has a charging-discharging connector 2. The electric vehicle 1 has a data interface 7 separate from the charging-discharging connector 2. The control electronics 3 and/or charging-discharging electronics 4 of the electric vehicle 1 can be coupled to the data interface 7 to evaluate and implement control commands received via the data interface 7.

The testing apparatus 60 has an interface 12 for coupling to the charging-discharging connector 2. The control device has an interface 17, separate from the interface 12 via which the discharging current is received from the charging-discharging connector 2, via which interface 17 the control command to initiate the discharging process can be transmitted to the electric vehicle 1. The data interface 7 and the interface 17 of the testing apparatus can be configured for example as RS232 or USB interfaces.

The further configuration and operation of the testing apparatus 60 corresponds to that of the testing apparatus 10.

While exemplary embodiments have been described in detail with reference to the figures, alternative or additional features may be used in further exemplary embodiments. For example, while control commands for triggering a discharging process may be digital commands, the control commands may also be implemented as analog signals.

While in exemplary embodiments the energy discharged from the traction battery may be at least partially fed back into an electrical network, the discharged energy may alternatively also be dissipated.

While in exemplary embodiments the testing apparatus may be supplied with energy at least during the discharging process by the traction battery via the charging-discharging connector, in other exemplary embodiments the testing apparatus may be fed also during the discharging process of the traction battery by an electrical network.

While a charging-discharging connector may be used as the charging-discharging interface for charging and discharging the traction battery of the electric vehicle, alternatively another embodiment of the charging-discharging interface may also be used. For example, a wireless energy transmission can take place during the charging and/or discharging, using an inductive coupling between the testing apparatus and the electric vehicle, so that no plug contacts are needed. In this case, the same inductors can be used both for charging and discharging the battery.

The charging-discharging connector may be configured according to a suitable standardisation (e.g. IEC 62196). A separate connection contact may be provided for transmission of control commands. Alternatively or additionally, control commands may be transmitted in a PLC ("Power Line Communication") technology via the connection contacts, via which energy is also transmitted during charging and discharging of the traction battery. During charging and discharging, an energy transmission may also take place via control pins of the charging-discharging connector, in order to realise a PLC.

Methods, devices and systems according to exemplary embodiments allow a battery testing of the traction battery which requires no pre-existing knowledge about the electric vehicle and its on-board system.

Methods, devices and systems according to exemplary embodiments may be used in particular for testing the traction battery of an all-electric vehicle or a hybrid vehicle.

The invention claimed is:

1. A method for testing a traction battery of an electric vehicle, which battery is both chargeable and dischargeable, the method comprising:
electrically coupling a mobile testing apparatus that is separate from the electric vehicle to the traction battery of the electric vehicle via a first mobile testing apparatus interface;
generating a control command in the mobile testing apparatus for initiating a discharging process of the traction battery;
monitoring the discharging process of the traction battery;
determining at least one characteristic quantity of the traction battery depending on the monitored discharging process; and
generating a supply voltage from a supply circuit of the mobile testing apparatus for at least one element of the mobile testing apparatus from an energy flow which, during the discharging process, flows via the first mobile testing apparatus interface to the supply circuit of the mobile testing apparatus.

2. The method according to claim 1, further including transmitting the control command via the first mobile testing apparatus interface to the electric vehicle.

3. The method according to claim 2, further including generating the control command according to a V2G protocol.

4. The method according to claim 3, further including coupling the mobile testing apparatus to a building network or an energy network and initiating with the control command in a V2G network operation a feeding of energy from the traction battery into the building network or the energy network.

5. The method according to claim 1, further including reserving the control command for testing the traction battery.

6. The method according to claim 1, further including transmitting the control command via a second interface of the mobile testing apparatus to the electric vehicle, which interface is different from the first mobile testing apparatus interface.

7. The method according to claim 1, further including coupling the mobile testing apparatus to a building network or an energy network and feeding at least part of the energy stored in the traction battery into the building network or the energy network during the discharging process.

8. The method according to claim 1, wherein the step of monitoring the discharging process comprises detecting at least one of an electrical charge and electrical energy discharged from the traction battery during the discharging process.

9. The method according to claim 1, wherein the step of determining the at least one characteristic quantity of the traction battery comprises determining a capacity of the traction battery depending on at least one of electrical charge and electrical energy discharged from the traction battery during the discharging process.

10. The method according to claim 1, wherein the step of determining at least one characteristic quantity of the traction battery comprises determining a system efficiency depending on at least one of electrical charge and electrical energy discharged from the traction battery during the discharging process.

11. The method according to claim 1, further comprising:
initiating a charging process of the traction battery;
monitoring the charging process of the traction battery; and
determining the at least one characteristic quantity of the traction battery depending on the monitored charging process and the monitored discharging process.

12. The method according to claim 1, further including storing in the mobile testing apparatus at least one predefined or user-configurable loading cycle for the discharging process.

13. Apparatus for testing a traction battery of an electric vehicle, comprising:
- a mobile traction battery tester distinct from the electric vehicle, the mobile traction battery tester including:
  - a mobile traction battery tester interface, the mobile traction battery tester being coupleable to the traction battery of the electric vehicle via the mobile traction battery tester interface, the mobile traction battery tester configured to output a control command for initiating a discharging process of the traction battery and the flow of electrical energy from the traction battery to the mobile traction battery tester via the mobile traction battery tester interface;
  - a monitoring unit associated with the mobile traction battery tester, the monitoring unit coupleable to the mobile traction battery tester interface and configured to monitor the discharging process of the traction battery in response to the control command and to determine at least one characteristic quantity of the traction battery depending on the monitored discharging process; and
  - a supply circuit within the mobile traction battery tester configured to generate a supply voltage for at least one element of the mobile traction battery tester from the electrical energy which, dining the discharging process, flows via the charging-discharging interface to the mobile traction battery tester.

* * * * *